(12) United States Patent
Scheuerlein et al.

(10) Patent No.: US 7,733,685 B2
(45) Date of Patent: Jun. 8, 2010

(54) CROSS POINT MEMORY CELL WITH DISTRIBUTED DIODES AND METHOD OF MAKING SAME

(75) Inventors: Roy E. Scheuerlein, Cupertino, CA (US); Luca Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 173 days.

(21) Appl. No.: 12/216,678

(22) Filed: Jul. 9, 2008

(65) Prior Publication Data
US 2010/0008124 A1 Jan. 14, 2010

(51) Int. Cl.
*G11C 11/00* (2006.01)
(52) U.S. Cl. .......................................... 365/148; 365/72
(58) Field of Classification Search .................... 365/69
See application file for complete search history.

(56) References Cited

U.S. PATENT DOCUMENTS

| | | | |
|---|---|---|---|
| 3,569,945 A | 1/1969 | Ho | |
| 3,693,173 A * | 9/1972 | Heightley et al. | 365/72 |
| 4,646,266 A | 2/1987 | Ovshinsky et al. | |
| 5,751,012 A | 5/1998 | Wolstenholme et al. | |
| 5,835,396 A | 11/1998 | Zhang | |
| 5,915,167 A | 6/1999 | Leedy | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,420,215 B1 | 7/2002 | Knall et al. | |
| 6,579,760 B1 | 6/2003 | Lung | |
| 6,618,295 B2 | 9/2003 | Scheuerlein | |
| 6,753,561 B1 | 6/2004 | Rinerson et al. | |
| 6,912,153 B2 | 6/2005 | Tihanyi | |
| 7,035,141 B1 * | 4/2006 | Tripsas et al. | 365/175 |
| 7,106,652 B2 | 9/2006 | Scheuerlein | |
| 7,283,383 B2 * | 10/2007 | Kang | 365/148 |
| 2004/0160819 A1 | 8/2004 | Rinerson et al. | |
| 2005/0180203 A1 | 8/2005 | Lin et al. | |
| 2005/0269553 A1 | 12/2005 | Sen et al. | |
| 2006/0002173 A1 | 1/2006 | Parkinson et al. | |
| 2006/0006463 A1 | 1/2006 | Islam et al. | |
| 2009/0067229 A1 | 3/2009 | Kang et al. | |
| 2009/0180309 A1 * | 7/2009 | Liu | 365/148 |
| 2010/0008123 A1 * | 1/2010 | Scheuerlein | 365/148 |

FOREIGN PATENT DOCUMENTS

EP  1 659 593 A2  5/2006

(Continued)

OTHER PUBLICATIONS

U.S. Appl. No. 09/560,626, filed Apr. 28, 2000, Knall.

(Continued)

*Primary Examiner*—Tan T. Nguyen
(74) *Attorney, Agent, or Firm*—Foley & Lardner LLP

(57) ABSTRACT

A cross point memory cell includes a portion of a first distributed diode, a portion of a second distributed diode, a memory layer located between the portion of the first distributed diode and the portion of a second distributed diode, a bit line electrically connected to the first distributed diode, and a word line electrically connected to the second distributed diode.

29 Claims, 9 Drawing Sheets

FOREIGN PATENT DOCUMENTS

| | | |
|---|---|---|
| EP | 1 892 722 A1 | 2/2008 |
| WO | WO 03/085675 A2 | 10/2003 |
| WO | WO 2008/062688 A1 | 5/2008 |
| WO | WO 2008/140979 A1 | 11/2008 |
| WO | WO 2008/157049 A1 | 12/2008 |

OTHER PUBLICATIONS

U.S. Appl. No. 09/638,428, filed Aug. 14, 2000, Johnson.
U.S. Appl. No. 09/897,705, filed Jun. 29, 2001, Kleveland.
U.S. Appl. No. 10/185,508, filed Jun. 27, 2002, Cleeves.
U.S. Appl. No. 11/287,452, filed Nov. 23, 2005, Herner.
Peter K. Naji et al., "A 256kb 3.0V 1T1MTJ Nonvolatile Magnetoresistive RAM", Digest of Technical Papers of the 2001 IEEE International Solid-State Circuits Conference, ISSCC 2001/Session 7/Technology Directions: Advanced Technologies/7.6, Feb. 6, 2001, 3 pgs.
U.S. Appl. No. 12/216,677, filed Jul. 9, 2008, Scheuerlein.
International Search Report and Written Opinion mailed Aug. 21, 2009, received in PCT/US2009/049513.
International Search Report and Written Opinion mailed Aug. 28, 2009, received in PCT/US2009/049502.

* cited by examiner

US 7,733,685 B2

CROSS POINT MEMORY CELL WITH DISTRIBUTED DIODES AND METHOD OF MAKING SAME

BACKGROUND

The present invention relates generally to the field of memory devices and more specifically to the field of nonvolatile memory devices containing diode steering elements.

Three dimensional memories have memory cells located at numerous levels above a substrate. Each level includes a plurality of parallel first lines, such as word lines, extending in one direction. The first lines are vertically separated from a plurality of parallel second lines, such as bit lines, extending in a second direction. The first lines may extend perpendicular to the first lines. Cells are located between the first lines and second lines at the intersections of these lines. These memories are described, for example, in U.S. Pat. Nos. 5,835,396 and 6,034,882.

Another way of fabricating three-dimensional memory arrays uses "rail-stacks" as described in U.S. Pat. No. 6,420,215 and in U.S. patent application Ser. No. 09/560,626 by N. Johan Knall, filed Apr. 28, 2000, which describes a memory employing antifuses where a diode is formed upon programming a particular bit. The previous designs only have one diode in series with a memory layer in each cell.

SUMMARY

One embodiment of the invention relates to a cross point memory cell, comprising a portion of a first distributed diode, a portion of a second distributed diode, a memory layer located between the portion of the first distributed diode and the portion of a second distributed diode, a bit line electrically connected to the first distributed diode, and a word line electrically connected to the second distributed diode.

Another embodiment of the invention relates to a memory device comprising a plurality of cross point memory cells, wherein each memory cell of the plurality of memory cells comprises a resistivity switching material and two distributed diodes, and each one of said two distributed diodes of each memory cell is shared with different memory cells of the plurality of memory cells.

Another embodiment of the invention relates to a semiconductor device comprising a first rail structure, wherein the first rail structure comprises a first distributed diode, a second rail structure, wherein the second rail structure comprises a second distributed diode, and a memory layer located between the first and the second rail structures.

Another embodiment of the invention relates to a method of manufacturing a semiconductor device, comprising forming a first rail structure, wherein the first rail structure comprises a first distributed diode, forming a memory layer over the first rail structure, and forming a second rail structure over the first layer of memory material, wherein the second rail structure comprises a second distributed diode.

DETAILED DESCRIPTION

A structure and method for fabricating two distributed diodes forming a cross point resistor cell for three dimensional memory arrays are described. In the following description, for purposes of explanation, numerous specific details are set forth to provide a thorough understanding of exemplary embodiments of the invention. It will be evident, however, to one skilled in the art that the invention may be practiced without these specific details. The terms word line, bit line, x-line and y-line are used interchangeably. The drawings are not to scale. In other instances, well-known structures and devices are shown in simplified form to facilitate description of the exemplary embodiments.

The term "distributed diode", as used herein, means a diode which is shared between two or more memory cells. Preferably, a distributed diode is electrically connected: i) to a single word line or a single bit line; and ii) to a memory layer of two or more memory cells. Preferably, each memory cell includes a memory layer located between and electrically connected to portions of first and second distributed diodes. Preferably, each pair of distributed diodes comprises first and second rail shaped diodes which cross each other in one unique memory cell and which are separated from each other by the memory layer of this one unique memory cell.

The cross point memory cell has a portion of a first distributed diode located above a memory layer and a portion of a second distributed diode located below the memory layer. A bit line is electrically connected to the first distributed diode. A word line is electrically connected to the second distributed diode.

Another embodiment of the invention relates to an array of cross point memory cells. Each memory cell of the array of cross point memory cells comprises a memory layer, such as a resistivity switching material, and two distributed diodes. Each one of the two distributed diodes is shared with different memory cells in the array of cross point memory cells. The resistivity switching material is only located at the junction between where the two distributed diodes cross. Alternatively, the resistivity switching material can be continuous throughout the array.

Another embodiment of the invention relates to grouping memory cells of an array of cross point memory cells. Memory cells are grouped into blocks of sixteen (4×4) cells or other suitable number of cells. Each distributed diode is shared amongst four or more individual memory cells within the group. Cell grouping reduces or prevents parasitic current leakage.

Structure of a Cross Point Memory Cell

Figure 1:
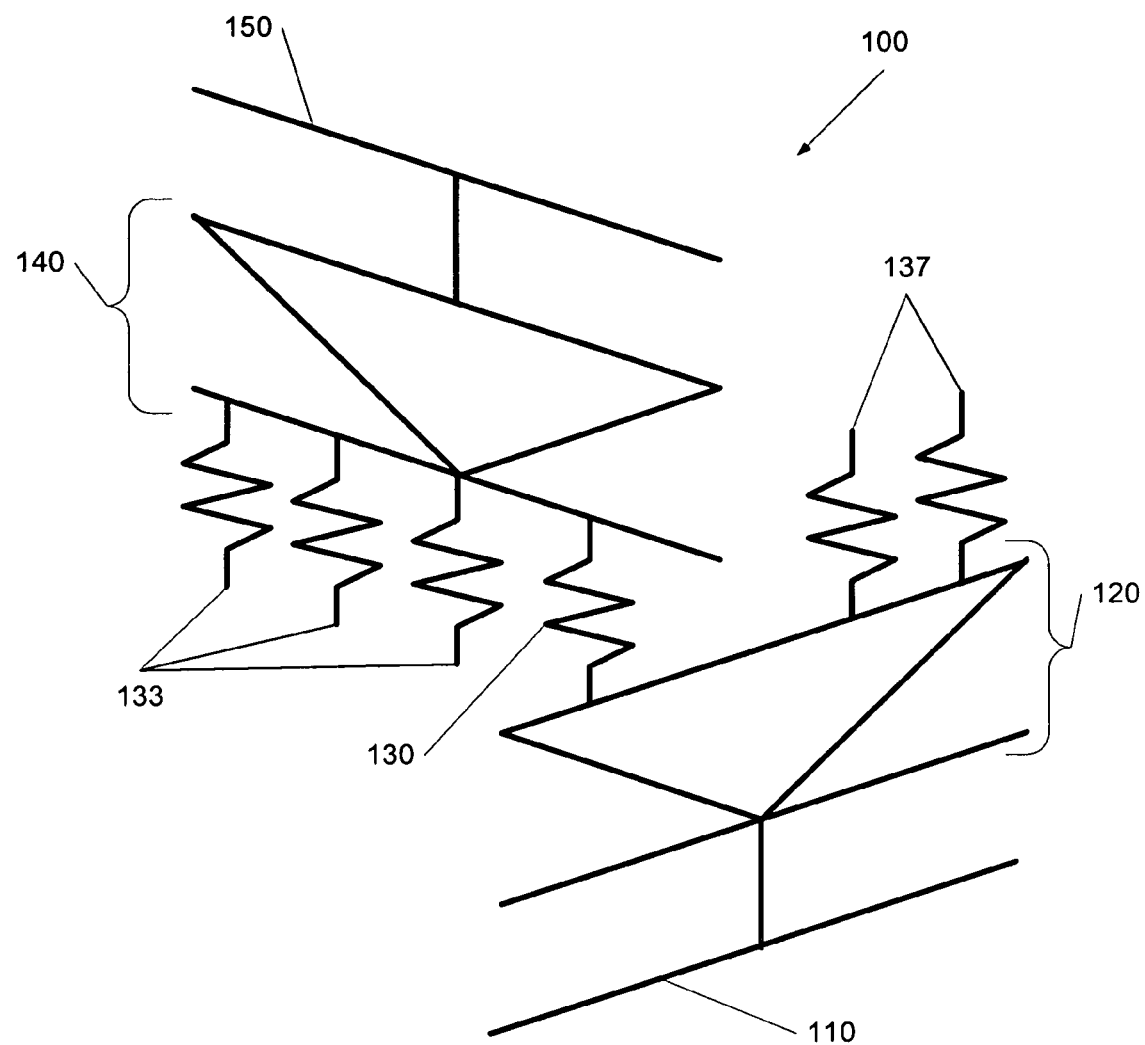
FIG. 1 is a diagram of a cross point memory cell in accordance with an exemplary embodiment.

Referring to FIG. 1, a diagram of a cross point memory cell 100 in accordance with an exemplary embodiment is shown. The cross point memory cell 100 includes a word line 110, a first distributed diode 120, a portion of memory layer 130, a second distributed diode 140, and a bit line 150. The positions of the word line and bit line may be reversed if desired. The first distributed diode 120 and the second distributed diode 140 are arranged and extend perpendicular to each other (i.e., cross each other at an angle of 90 degrees). Alternatively, the first distributed diode 120 and the second distributed diode 140 can cross each other at angles other than ninety degrees.

The word line 110 and the bit line 150 are made of one or more layers of conductive material, such as copper, aluminum, titanium, tungsten, alloys thereof, titanium nitride, etc. The word line 110 and the bit line 150 are connected to driving circuitry (also referred to as driver circuits, not shown for clarity) located below, above or to the side of the memory cells. The driving circuitry biases the first distributed diode 120 and the second distributed diode 140, and also includes circuitry for reading and writing to the cross point memory cell 100.

The first distributed diode 120 and the second distributed diode 140 can be any suitable diodes, such as semiconductor diodes. Examples of semiconductor diodes include p-n and p-i-n semiconductor diodes formed in single crystal, polycrystalline or amorphous semiconductor material, such as silicon, germanium, silicon-germanium or compound semiconductors, such as Group III-V or II-VI semiconductors. Alternatively, the first distributed diode 120 and the second distributed diode 140 can be a metal insulator metal (MIM) diode, a metal insulator-insulator metal (MIIM) diode, tunneling diodes, or any two terminal non-linear conducting device. Likewise, the first distributed diode 120 and the second distributed diode 140 can comprise different types of diodes or fabricated with different diode properties.

The portion of memory layer 130 is preferably a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

The first distributed diode 120 is shared with other portions of memory layer along the word direction 137. Hence, the effective diode area of the first distributed diode 120 is large relative to the contact area of the portion of memory layer 130, allowing more current to pass the contact area than if the diode and the memory layer had the same area.

The second distributed diode 140 is shared with other portions of memory layer along the bit direction 133. Hence, the effective diode area of the second distributed diode 140 is large relative to the contact area of the portion of memory layer 130, allowing more current to pass the contact area than if the diode and the memory layer had the same area.

Hence, when the first distributed diode 120 and the second distributed diode 140 are biased, current is allowed to flow only through the portion of memory layer 130. Notably, current does not flow through other portions of memory layer along the word direction 137 or other portions of memory layer along the bit direction 133. Advantageously, the combined diode area of the first distributed diode 120 and the second distributed diode 140 is much larger than the contact area of the portion of memory layer 130. Consequently, a stronger current can be applied to the portion of memory layer 130 than would be possible if the diode areas were the same as the area of the memory layer. Additionally, if only one distributed diode were present, there would be a sneak path between adjacent array lines. In the present embodiment, the second distributed diode intercepts the sneak path.

Figure 2:
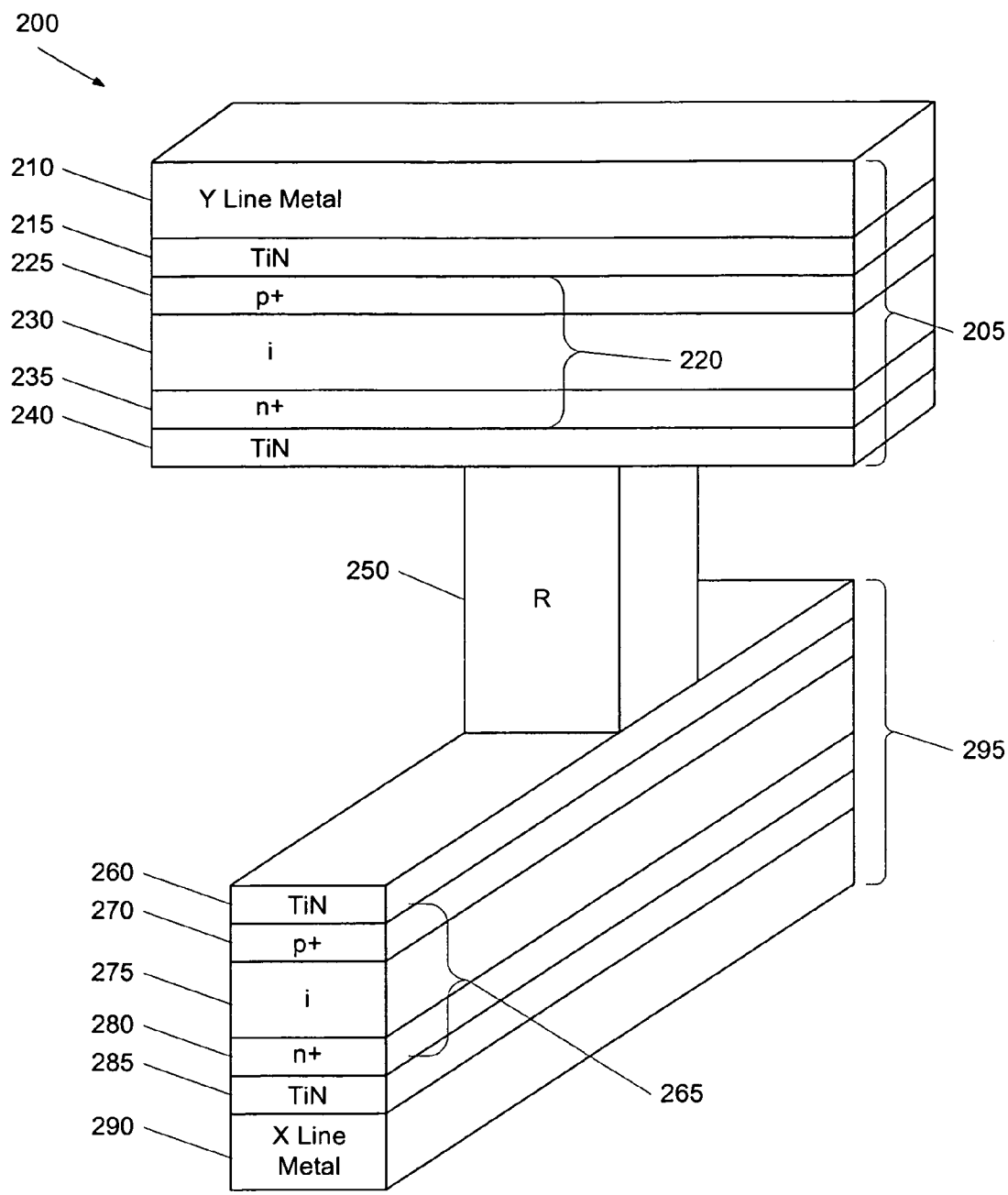
FIG. 2 is a perspective view of a cross point memory cell in accordance with an exemplary embodiment.

Referring to FIG. 2, a perspective view of a cross point memory cell 200 in accordance with an exemplary embodiment is shown. The cross point memory cell 200 includes a y-line 210, a first distributed diode 220, a memory layer 250, a second distributed diode 265, and a x-line 290. The y-line 210 and the x-line 290 may correspond to the bit line 150 and word line 110 shown in FIG. 1. The locations of the x-line and y-line may be reversed if desired. The memory layer 250 corresponds to the memory layer 130 in FIG. 1 and the diodes 220, 265 correspond to the first and second diodes 120 and 140 in FIG. 1.

In the non-limiting example of FIG. 2, the first distributed diode 220 and the second distributed diode 265 are rail shaped and extend in perpendicular directions (i.e., cross each other at an angle of 90 degrees). The first distributed diode 220 is a p-i-n semiconductor diode and includes a first p-type layer 225, a first intrinsic layer 230, and a first n-type layer 235. The second distributed diode 265 is also p-i-n semiconductor diode and includes a second p-type layer 270, a second intrinsic layer 275, and a second n-type layer 280. The p-type and n-type layers are preferably heavily doped and the intrinsic layer is either completely intrinsic or inherently slightly p-type or slightly n-type. Preferably, both diodes are arranged in the same direction with regard to the current flow between the bit line and the word line. While the size and shape of both diodes is illustrated to be the same, the size and shape of the first distributed diode 220 and the second distributed diode 265 can be different. Alternatively, other diode types can also be used.

The cross sectional area of the y-line 210 is preferably about the same as the cross sectional area of the first distributed diode 220. Line 210 and diode 220 may be patterned into a common rail during the same photolithography step. The y-line 210 and the first distributed diode 220 may be electrically connected to each other by an optional first conductive barrier 215 made of titanium nitride (TiN) or other conductive material. The first distributed diode 220 is electrically connected to the memory layer 250 by an optional second conductive barrier 240 made of TiN or other conductive material. The second conductive barrier 240 covers the entire bottom surface area of the first distributed diode 220. The barrier 240 may be patterned into the common rail with y-line 210 and diode 220 during the same photolithography step such that the y-line 210, the first conductive barrier 215, the first distributed diode 220, and second conductive barrier 240 form a first rail structure 205. The memory layer 250 covers only a small portion of the bottom surface of the second conductive barrier 240. In alternative embodiments, the memory layer can be a portion of the first rail structure and cover the whole bottom surface of the first rail structure 205 and/or the memory layer can be a sheet which extends beyond the second conductive barrier 240 (i.e., the memory layer may be patterned into the first rail structure 205 during the step of patterning the structure or the memory layer may be a sheet which extends beyond the first common rail structure).

The memory layer 250 is electrically connected to the second distributed diode 265 by an optional third conductive barrier 260 made of TiN or another conductive material. The third conductive barrier 260 covers the entire upper surface area of the second distributed diode 265. The memory layer 250 covers only a small portion of the upper surface of the third conductive barrier 260. In alternative embodiments, the memory layer may be a portion of the same rail as the third conductive barrier and cover the whole upper surface of the third conductive barrier or it can be a sheet which extends beyond the third conductive barrier 260. The second distributed diode 265 and the x-line 290 are electrically connected by an optional fourth conductive barrier 285 made of TiN or another conductive material. The cross sectional area of the x-line 290 is about the same as the cross sectional area of the second distributed diode 265. The x-line 290, the fourth conductive barrier 285, the second distributed diode 265, and third conductive barrier 260 form a second rail structure 295 which can be formed by patterning the x-line 290, the fourth conductive barrier 285, the second distributed diode 265, and third conductive barrier 260 (and optionally the memory layer 250) during the same patterning step using the same mask.

Hence, when the first distributed diode 220 and the second distributed diode 265 are biased, current is allowed to flow only through the memory layer 250. Advantageously, the combined diode area of the first distributed diode 220 and the second distributed diode 265 is much larger than the contact area of the memory layer 250. Consequently, a stronger current can be applied to the memory layer 250 than would be possible if the diode areas were the same as the area of the memory layer. Additionally, if only one distributed diode were present, there would be a sneak path between adjacent rail structures. The sneak path is through a portion of memory layer, through the TiN contact, and then through an adjacent portion of memory layer. In the present embodiment, the second distributed diode intercepts the sneak path.

Alternatively, the first and second distributed diodes may comprise nanowire diodes. A nanowire has a cross sectional dimension on a nanometer scale, such as 1-100 nm for example. The nanowire diode can be grown as a filament using a catalyst particle and/or grown through an opening in a mask on growth conducive surface. The nanowire may have the p-type, n-type and optional intrinsic regions arranged in longitudinal or radial directions. In other words, the p, i, and n type regions may be stacked in the longitudinal direction from the base to the tip of the nanowire. Alternatively, the core of the nanowire may have one conductivity type and a shell around the core may have the opposite conductivity type. The optional intrinsic region may be located between the core and the shell.

Figure 3:
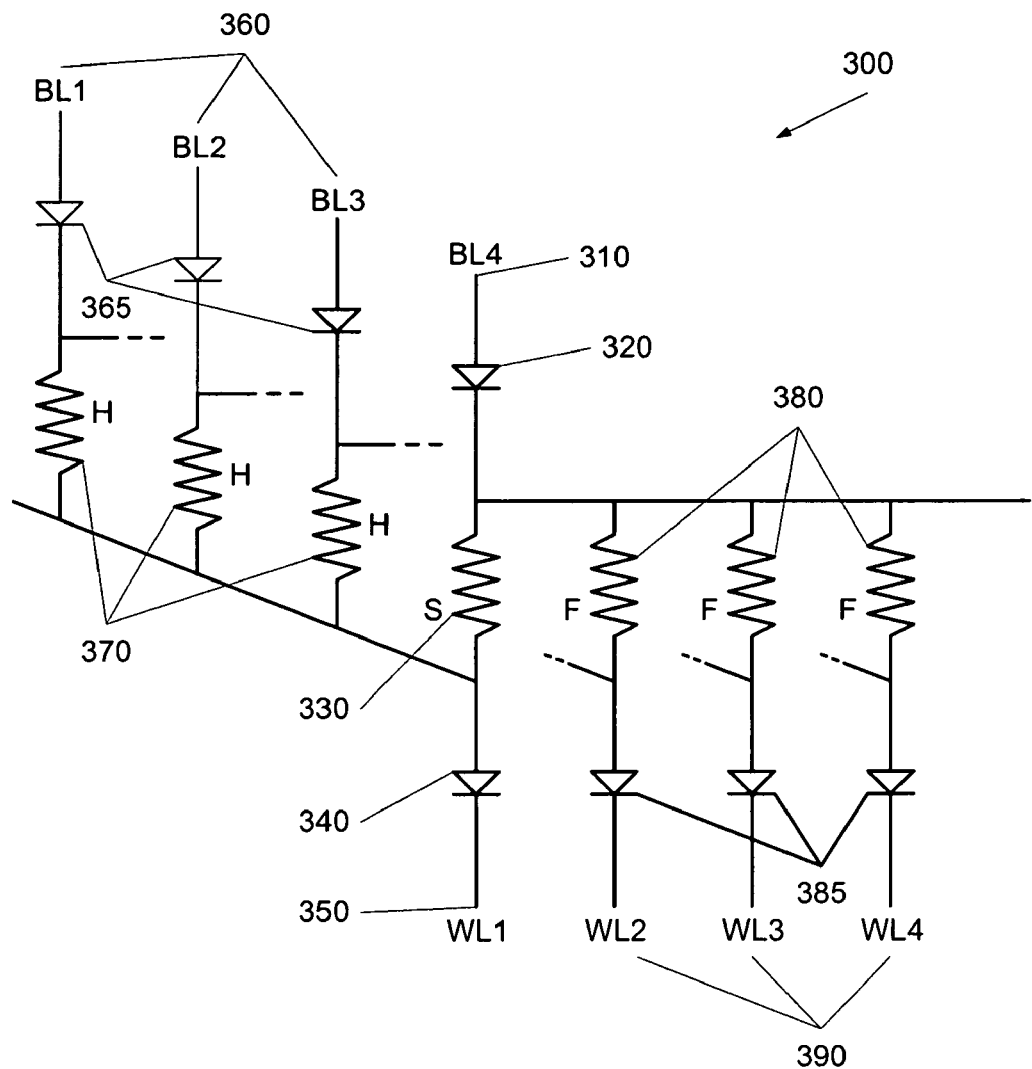
FIG. 3 is a schematic of the cross point memory cell array in accordance with an exemplary embodiment.

FIG. 3 illustrates a schematic of the cross point memory array 300 containing several cells 200 of FIG. 2 in accordance with an exemplary embodiment. The electrical schematic of the cross point memory array 300 illustrates one memory cell "S" (which corresponds to cells 100, 200 of FIGS. 1 and 2) which includes a portion of a first bit line 310, a portion of a bit line side distributed diode 320 (referred to as "bit side distributed diode"), a memory layer 330, a portion of a word line side distributed diode 340 (referred to as "word side distributed diode") and a portion of a first word line 350. The bit side distributed diode 320 and the word side distributed diode 340 are logically orthogonal so that one memory cell can be selected by selecting one bit side distributed diode and one word side distributed diode.

The bit side distributed diode 320 is also electrically connected to other bit direction memory layers 380 of adjacent memory cells "F". Each of these other bit direction memory layers 380 in cells "F" are electrically connected to other word side distributed diodes 385 and other word lines 390 (WL2, WL3 and WL4). The word side distributed diode 340 is also electrically connected to other word direction memory layers 370 of adjacent memory cells "H". Each of these other word direction memory layers 370 in cells "H" are electrically connected to other bit side distributed diodes 365 and other bit lines 360 (BL1, BL2 and BL3).

In FIG. 3, the memory cell "S" containing memory layer 330 is activated (as denoted by "S" for selected) by biasing the bit side distributed diode 320 and biasing the word side distributed diode 340 by applying a voltage between word line 350 and bit line 310. Additionally, the other word direction memory cells "H" containing memory layers 370 are half selected on the word line (as denoted by "H") by the biasing of the word side distributed diode 340. Likewise, the other bit direction memory cells "F" containing memory layers 380 are half selected on the bit line by the biasing of the bit side distributed diode 320. Hence, current will only flow through the memory cell "S" containing memory layer 330 and not through the other word direction memory cells "H" or the other bit direction memory cells "F". The other word side distributed diodes 385 intercept the sneak paths on the word side while other bit side distributed diodes 365 intercept the sneak paths on the bit side. Thus, a unique current path exists through each selected memory cell (such as cell "S") between each bit line (such as 310) and each word line (such as 350). A preferred biasing of array lines in one embodiment comprises a highest bias Vpp on the selected bit line, ground on the selected word line, ground plus an offset voltage on unselected bit lines and Vpp less an offset voltage on the unselected word lines. In one embodiment the offset voltages for programming the selected memory cell are about twice the diode turn on voltage, and the offset voltages for reading the selected memory cell could be significantly less than twice the diode turn on voltage or even zero volts.

Figure 4:
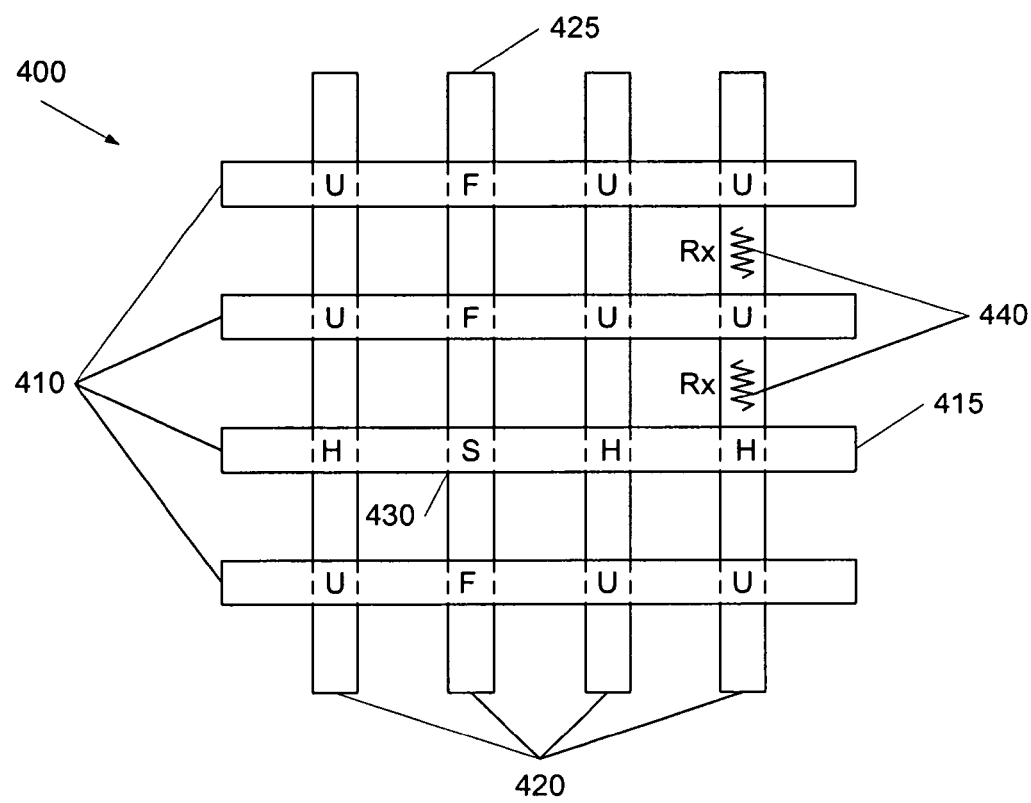
FIG. 4 is a bottom view of a cross point memory cell array in accordance with an exemplary embodiment.

Referring to FIG. 4, a bottom view of a cross point memory cell array 400 in accordance with an exemplary embodiment is shown. The cross point memory cell array 400 includes word rail structures 410 and bit rail structures 420 such as structures 295, 205 shown in FIG. 2. Memory cell material is located between the junctions where the word rail structures 410 and the bit rail structures 420 cross.

In FIG. 4, a memory cell 430 is activated (as denoted by "S" for selected) by biasing a selected word rail structure 415 and a selected bit rail structure 425. The other memory cells associated with the selected word rail structure 415 (denoted by "H") have a lower bias voltage. The other memory cells associated with the selected bit rail structure 425 (denoted by "F") have a lower bias voltage. All other memory cells are unselected (denoted by "U"). Current will only flow through memory cell 430 since it is the only cell biased above the diode threshold voltage on both sides.

The diodes can be rail shaped because the double diode arrangement avoids the near disturb problem. Disturb paths are avoided because injected carriers from one diode rail can not reach other diode rails due to recombination in the contact electrodes and the memory cell material. The diodes are shared between multiple memory cells so the area of the diode can be many times the area of the memory cell which stores one or more bits. For example, the bit side diode (or entire rail structure) can be shared by n memory cells (e.g., n memory layers or resistors) and the word line side diode (or entire rail structure) can be shared by m memory cells (e.g., m memory layers or resistors) extending in the perpendicular direction. The effective cell area is equal to the memory cell pitch squared. The memory cell is formed self aligned with the diodes at the crossing area of the top diode and the bottom diode, i.e. the memory layer 250 shown in FIG. 2 is etched with the bottom diode (or bottom rail 295) and etched again with the top diode (or top rail 205). Hence, a sub array of n by m memory layers or resistors has m diodes above and n diodes below.

If the memory layer is patterned twice (e.g., during the top and bottom rail patterning), then the memory layer portions are only located at the intersections of the top and bottom rails (e.g., the memory layer portions are self aligned to the intersection of the rails). In this configuration, the leakage paths between adjacent cells are minimized.

If the memory layer is patterned only once (e.g., patterned during the patterning of the top bit line rails but not during patterning of bottom bit line rails), then the memory layer will extend along entire rails, such as along the entire top rails. In this case, there is a lateral leakage path 440 (i.e., parasitic resistors) between adjacent cells along the top rails designated Rx in FIG. 4. This leakage path is comparable in current magnitude to an unselected cell (U) leakage, but is seen on the selected array lines rather than the leakage current of unselected cells which flows between unselected array lines. The lateral leakage path exists even if the even if the memory cell is patterned separately because the memory cell material (resistor) is sandwiched between conductive layers. The lateral leakage path shifts some of the unselected cell (U) leakage current to the selected bit line and word line. Segmenting the length of the diode rails can reduce the number of cells locations that contribute to this lateral leakage path and can affect the leakage current seen on the selected bit line and selected word line. If the leakage current on the selected bit line is too large, the memory cell signal is harder to sense accurately during reading and writing.

Figure 5:
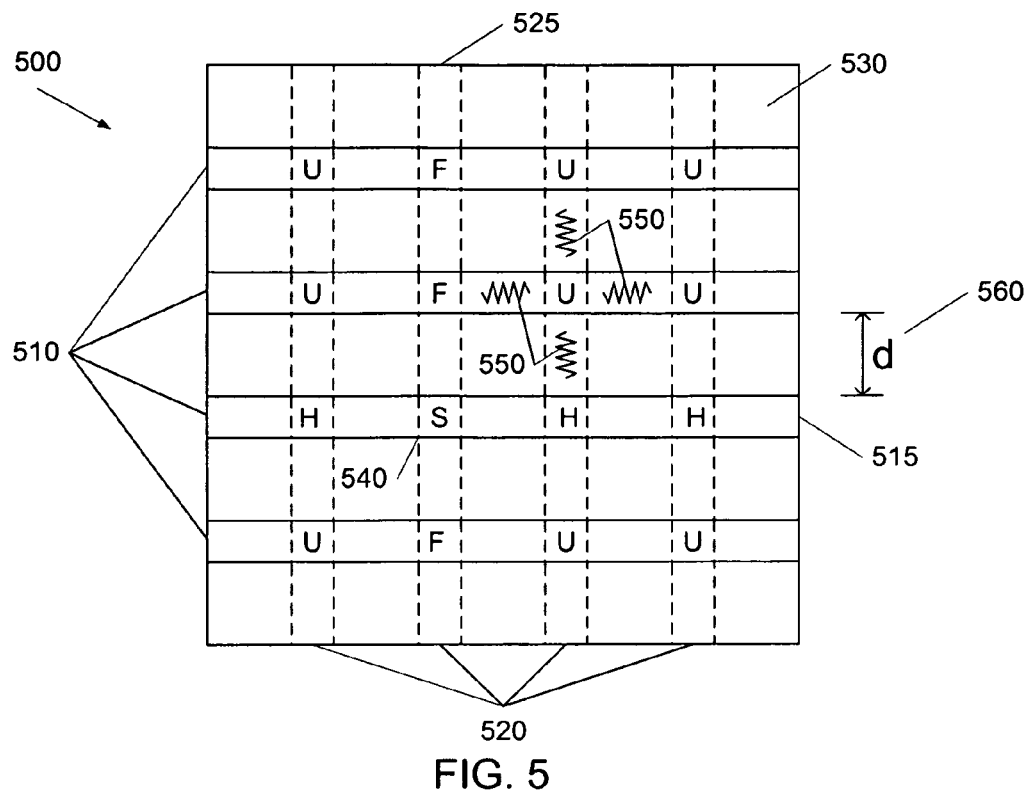
FIG. 5 is a bottom view of a cross point memory cell array with a continuous layer of memory layer in accordance with an exemplary embodiment.

Referring to FIG. 5, a bottom view of a cross point memory cell array 500 with a continuous layer of memory material in accordance with an exemplary embodiment is shown. The cross point memory cell array 500 includes word rail structures 510 and bit rail structures 520. The word rail structures 510 and the bit rail structures 520 are comprised of a distributed diode and a conductor. A memory material layer 530 runs continuously between the word rail structures 510 and the bit rail structures 520. In other words, the memory layer is not patterned during the patterning of the rails.

In FIG. 5, a memory cell area 540 is activated (as denoted by "S" for selected) by biasing a selected word rail structure 515 and a selected bit rail structure 525. The other memory cells associated with the selected word rail structure 515 are half biased (denoted by "H"). The other memory cells associated with the selected bit rail structure 525 are half biased (denoted by "F"). All other memory cells are unselected (denoted by "U"). Current will only flow through memory cell area 540 since it is the only area of the memory material layer 530 that is biased on both sides.

Figure 6:
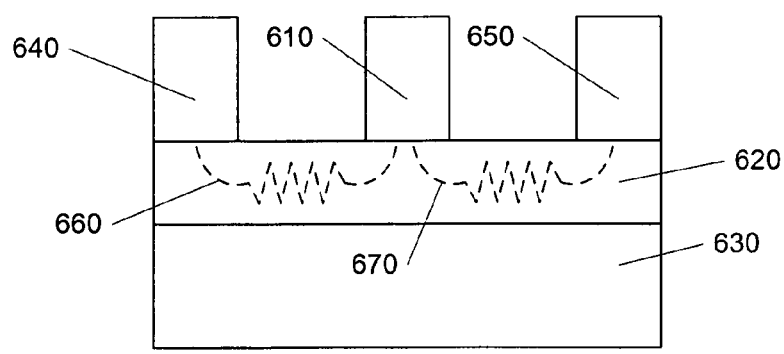
FIG. 6 is a side view diagram of the parasitic resistance path in accordance with an exemplary embodiment.

Parasitic resistors 550 indicate the parasitic leakage path in the layout. FIG. 6 shows a side view diagram of the parasitic resistance path in accordance with an exemplary embodiment. A cross point memory cell array has a selected word line 630, a memory material layer 620, a selected bit rail structure 610, a first adjacent bit rail structure 640, and a second adjacent bit rail structure 650. The selected bit rail structure 610 has a first parasitic resistance path 660 through the memory material layer 620 to the first adjacent bit rail structure 640. The selected bit rail structure 610 has a second parasitic resistance path 670 through the memory material layer 620 to the second adjacent bit rail structure 650.

Preferably a thin memory layer is used in this embodiment. For example, a thin deposited carbon resistivity switching material layer is about 2 to 10 Angstroms thick. A parasitic resistor length 560 of the parasitic resistors 550 is the line-to-line spacing "d" which is much larger than the thickness "t" of the memory material layer 530. The parasitic resistance value is proportional to d/t, while the vertical resistance value (i.e. the resistance of the memory material layer 530 between the word and bit line diode rails) is proportional to t/d. Therefore the thin memory material layer 530 has low leakage values compared to memory cell area currents. The memory cell areas are less likely to be damaged by programming voltages because the distance "d" is much larger than the thickness "t" of the resistance path in the cell area being programmed.

Figure 7:
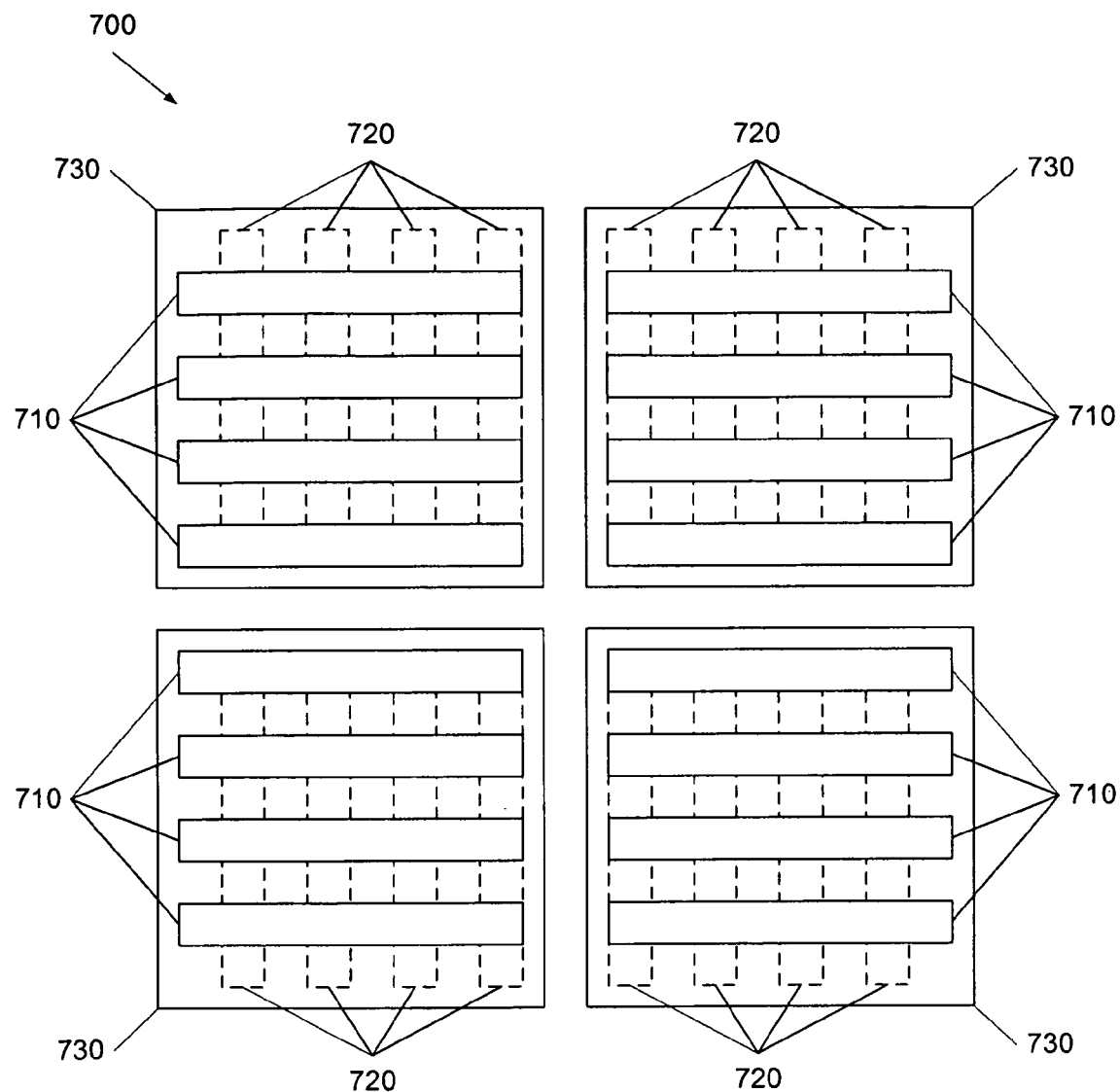
FIG. 7 is a bottom view of a cross point memory cell array with cell grouping in accordance with an exemplary embodiment.

Referring to FIG. 7, a bottom view of a cross point memory cell array 700 with cell grouping in accordance with an exemplary embodiment is shown. The cross point memory cell array 700 with cell grouping includes word line diode segments 710, bit line diode segments 720, and memory material blocks 730. The word line diode segments 710 and the bit line diode segments 720 are distributed diodes. The word line diode segments 710 are located below of the memory material blocks 730. The bit line diode segments 720 are located above memory material blocks 730. Note that the bit line and word line conductors are not shown for clarity. The bit line and word line conductors are much longer than the diode segments. If depicted, the bit line and word line conductors would run across the groupings. In this example, the word line diode segments 710 and the bit line diode segments 720 each only share four cell areas. Various numbers of cell areas or cells can be grouped together; for example, 4, 16, 256, or 16384 cells can be grouped together. Grouping the cell areas or cells limits the lateral leakage through the memory material layer because the shorter, segmented diodes have fewer leakage paths. Cell grouping is particularly applicable to metal oxide memory layer materials which are very hard to etch, and also to carbon nanotubes which are hard to pattern because of their roughness. Alternatively, the memory material layer can be continuous throughout the memory cell areas and between the arrays of memory cells, and only the distributed diodes are segmented. Thus, each word side rail includes a word line and two or more segmented distributed diodes, such that the word line is longer than each diode. Likewise, each bit side rail includes a bit line and two or more segmented distributed diodes, such that the bit line is longer than each diode.

In a three dimensional memory array, multiple levels of memory cells can be mirrored, half mirrored, or have separate X-line and Y line layers as is well known in the art of three dimensional memory arrays. In the half mirrored arrangement, the Y-line is shared between two levels of memory cells. The Y-line has diode layers both above and below. These can be patterned in a common process, or one diode patterned separately from another diode, plus line patterning. Alternatively, all three can be patterned separately.

Fabrication of a Cross Point Memory Cell

Figure 8:
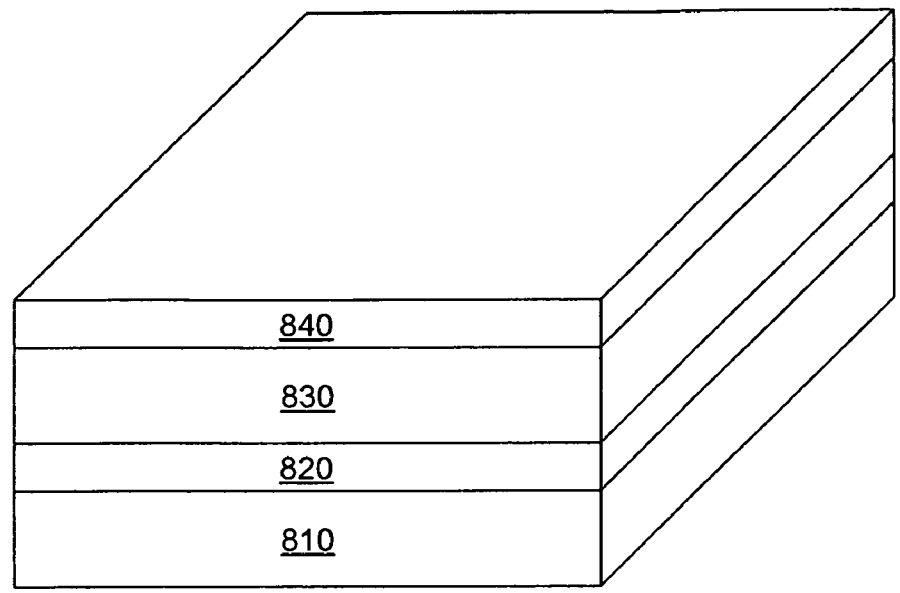
FIG. 8 is a perspective view of forming the first rail structures of a cross point memory cell array in accordance with an exemplary embodiment.

Referring to FIG. 8, a perspective view of forming the first rail structures of a cross point memory cell array in accordance with an exemplary embodiment is shown. The cross point memory cell array is formed on a substrate 810. For example, substrate 810 is silicon, silicon on insulator, or silicon grown on top on an existing memory level. Other semiconductor or non-semiconductor substrates can be used as known in the art. A word line layer 820 is formed on the substrate 810.

Next, a first diode layer 830 is formed on the word line layer 820. The first diode layer 830 may comprise two or three sublayers to form p-n or p-i-n semiconductor diode. Alternatively, the first diode layer 830 can be a metal insulator metal (MIM) diode, a metal insulator-insulator metal (MIIM) diode, tunneling diode, or any two terminal non-linear conducting device. The first diode layer 830 also includes optional barrier conductors as needed, for example, TiN.

Finally, a memory material layer 840 is formed on the first diode layer 830 using any suitable deposition methods, such as thermal CVD, PECVD, sputtering, thermal or plasma oxidation or nitridation, spin-coating, dip coating, etc. Layer 840 can include sublayers comprising a first layer of switchable resistor material and a second layer for top electrode for example Titanium Nitride and a third layer for CMP stopping for example Tungsten.

Figure 9:
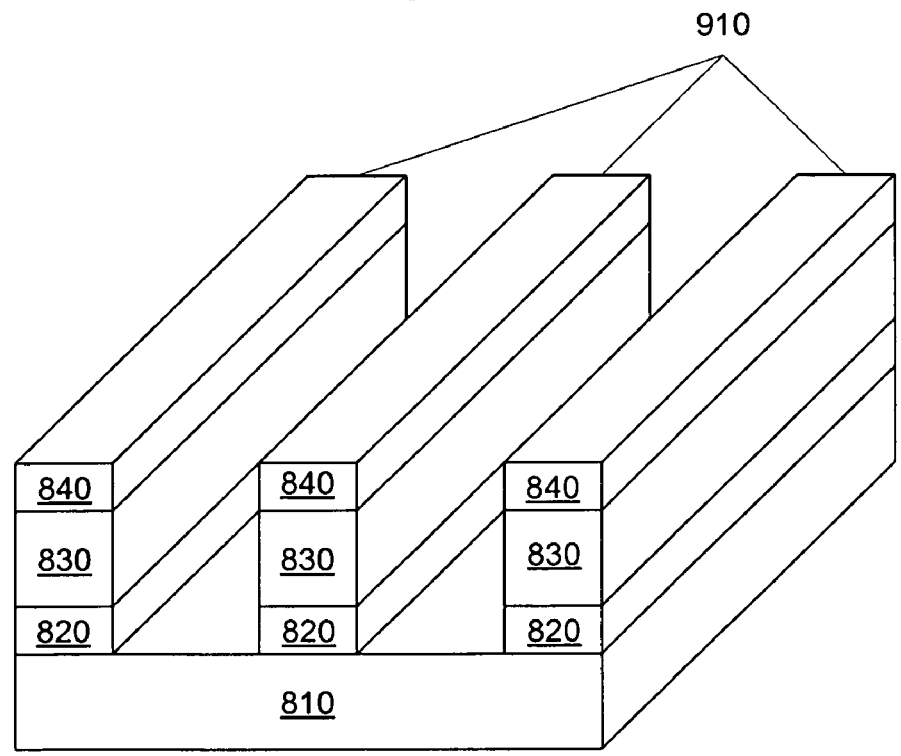
FIG. 9 is a perspective view of etched first rail structures of the cross point memory cell array of FIG. 8 in accordance with an exemplary embodiment.

Referring now to FIG. 9, a perspective view of etched first rail structures of the cross point memory cell array of FIG. 8 in accordance with an exemplary embodiment is shown. After the word line layer 820, the first diode layer 830, and the memory material layer 840 are formed on the substrate 810, a layer of photoresist is formed over the memory material layer 840. The photoresist layer is exposed with a word line pattern, developed, and baked as is well known in the art. Alternatively, patterning can be a double exposure or double patterning process, including the use of hard masks, in order to form smaller half pitches. The memory material layer 840, the first diode layer 830, and the word line layer 820 are etched through to the substrate 810 leaving word line rail structures 910. Any etching process can be used depending on the specific materials of the word line layer 820, the first diode layer 830, and the memory material layer 840 as is well known in the art.

Figure 10:
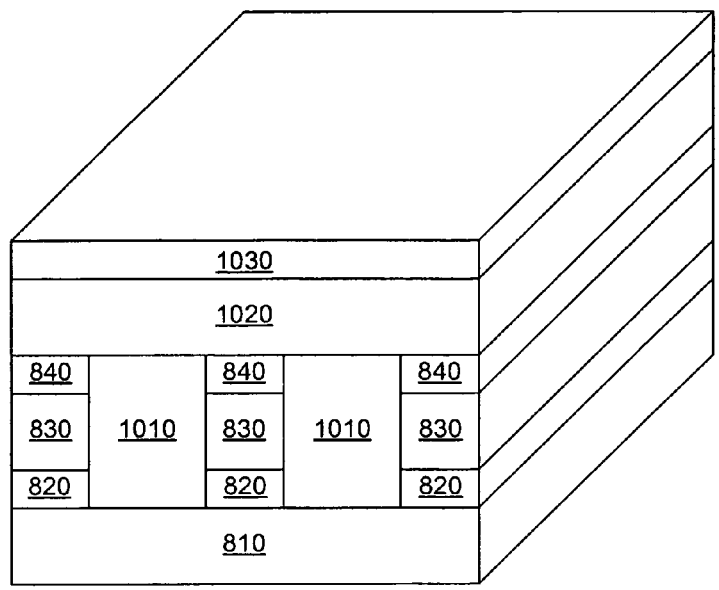
FIG. 10 is a perspective view of forming the second rail structures of the cross point memory cell array of FIG. 9 in accordance with an exemplary embodiment.

Referring now to FIG. 10, a perspective view of forming the second rail structures of the cross point memory cell array of FIG. 9 in accordance with an exemplary embodiment is shown. The trenches between the word line rail structures 910 are filled with a gap fill insulating material 1010, such as silicon dioxide (SiO$_2$). The surface of the insulating material 1010 is planarized using chemical-mechanical polishing (CMP) or etchback so that the memory material layer 840 is exposed. Layer 840 may have several sublayers as discussed above, where only the third sublayer comprising the CMP stop layer is exposed.

Next, a second diode layer 1020 is formed on the memory material layer 840. Layer 1020 may have several sublayers as discussed above. The second diode layer 1020 also includes optional barrier conductors as needed, for example, TiN. A conductive bit line layer 1030 is formed on the second diode layer 1020.

Figure 11:
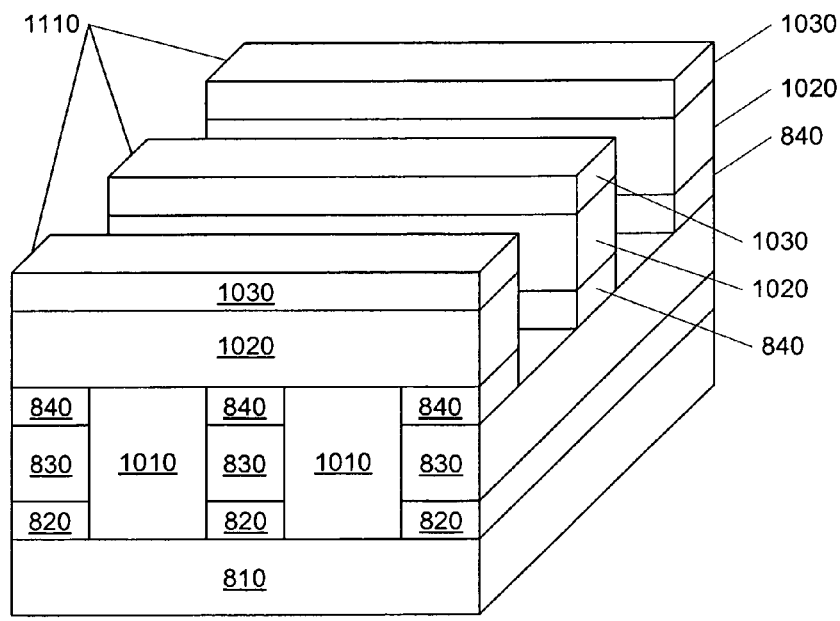
FIG. 11 is a perspective view of etched second rail structures of the cross point memory cell array of FIG. 10 in accordance with an exemplary embodiment.

Referring now to FIG. 11, a perspective view of etched second rail structures of the cross point memory cell array of FIG. 10 in accordance with an exemplary embodiment is shown. After the second diode layer 1020 and the bit line layer 1030 are formed on the memory material layer 840, a layer of photoresist is formed on the bit line layer 1030. The photoresist layer is exposed with a bit line pattern, developed and baked as is well known in the art. The bit line pattern is generally orthogonal to the word line pattern. However, other angles can be used. Alternatively, patterning can be a double exposure or double patterning process, including the use of hard masks, in order to form smaller half pitches. The bit line layer 1030, the second diode layer 1020, and the memory material layer 840 are etched through to the first diode layer 830 leaving bit line rail structures 1110. The memory material layer 840 is only left in the areas where the word line rail structures 910 and bit line rail structures 1110 cross. Hence, the memory material layer 840 has been formed into individual memory cells.

Figure 12:
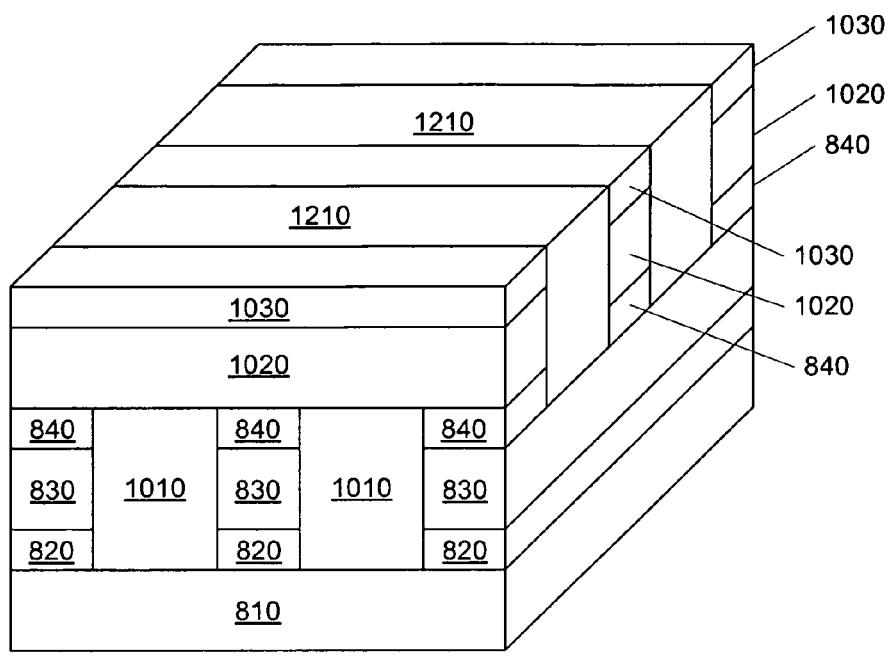
FIG. 12 is a perspective view of a completed cross point memory cell array of FIG. 11 in accordance with an exemplary embodiment.

Referring now to FIG. 12, a perspective view of a completed cross point memory cell array of FIG. 11 in accordance with an exemplary embodiment is shown. The trenches between the bit line rail structures 1110 are filled with a gap fill insulating material 1210, such as silicon dioxide (SiO$_2$). The surface of the insulating material 1210 is planarized using chemical-mechanical polishing (CMP) or etchback so that the bit line layer 1030 of the bit line rail structures 1110 is exposed. Advantageously, individual memory cells of the memory material layer 840 have been formed by self alignment. Hence, the cross point memory cell array is particularly well suited for deep submicron manufacturing processes. Alternatively, the memory material layer 840 can be etched to match with either the bit line rail structures 1110 or the word line rail structures 910 so that long strips of the memory material layer 840 remain. In other words, the etching step shown in FIG. 11 either does not etch the memory material layer or the memory material layer is formed on top of layer 1010 after the etching of the word line rail structures. Likewise, the patterning, forming, and etching operations can easily be modified to create the structures described above such as a cross point memory cell array with cell grouping.

Figure 13:
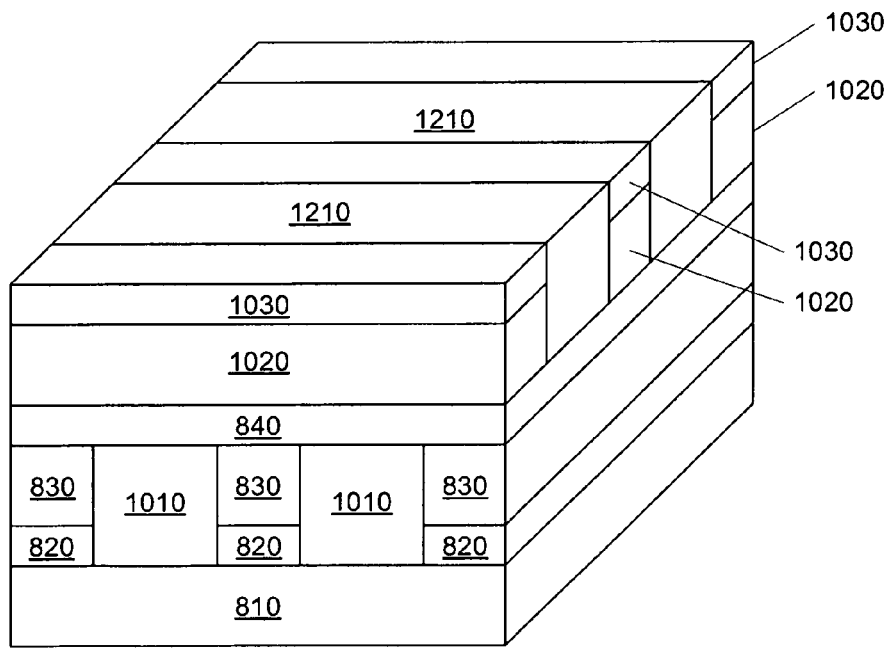
FIG. 13 is a perspective view of a completed cross point memory cell array with a continuous layer of memory layer in accordance with an exemplary embodiment.

Referring now to FIG. 13, a perspective view of a completed cross point memory cell array with a continuous layer of memory layer in accordance with an exemplary embodiment is shown. In this exemplary embodiment, a word line layer 820 and a first diode layer 830 formed on a substrate 810 are etched through to the substrate 810 before the memory material layer 840 is formed. After filling the trenches with an insulating material 1010, the memory material layer 840 is formed, followed by forming the second diode layer 1020 and the bit line layer 1030. The bit line layer 1030 and the second diode layer 1020 are etched through to the memory material layer 840 so that the memory material layer 840 remains continuous throughout the cross point memory cell array. Finally, the trenches are filled with an insulating material 1210.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, the order of fabrication of the layers may be changed without deviating from the spirit of the invention. Likewise, the device and methods of the present invention may be practiced using other passive element memory systems. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n– region by an antifuse element. When the antifuse element is programmed, the p+ region is electrically connected to the n– region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, carbon nanotube layers, which may be formed as described in US Patent Pub 20050269553 Sen, Rahul; et al. which is hereby incorporated by reference, and amorphous, polycrystalline or microcrystalline carbon layers can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A cross point memory cell, comprising:
   a portion of a first distributed diode;
   a portion of a second distributed diode;
   a memory layer located directly between the portion of the first distributed diode and the portion of a second distributed diode;
   a bit line electrically connected to the first distributed diode; and
   a word line electrically connected to the second distributed diode.

2. The cross point memory cell of claim 1, wherein the memory layer comprises a discontinuous layer whose portions are located only in locations between the first distributed diode and the second distributed diode where the first distributed diode crosses the second distributed diode.

3. The cross point memory cell of claim 1, wherein the memory layer comprises a continuous layer which extends beyond the first and the second distributed diodes.

4. The cross point memory cell of claim 1, wherein:
   the first distributed diode comprises a p-n semiconductor diode, a p-i-n semiconductor diode, a metal insulator metal (MIM) diode, or a metal insulator-insulator metal (MIIM) diode;
   the second distributed diode comprises a p-n semiconductor diode, a p-i-n semiconductor diode, a metal insulator metal (MIM) diode, or a metal insulator-insulator metal (MIIM) diode; and
   the memory layer comprises a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

5. A memory device comprising a plurality of cross point memory cells, wherein:
   each memory cell of the plurality of memory cells comprises a resistivity switching material located directly between two distributed diodes; and
   each one of said two distributed diodes of each memory cell is shared with different memory cells of the plurality of memory cells.

6. The device of claim 5, further comprising a plurality of bit lines and a plurality of word lines, such that a unique current path exists through each memory cell between each bit line and each word line.

7. The device of claim 6, wherein:
   the plurality of memory cells comprise a first memory cell, a second memory cell, a third memory cell and a fourth memory cell;
   the first memory cell comprises a first distributed diode which is shared with the second memory cell, a first resistivity switching material region, and a second distributed diode which is shared with the third memory cell;

the second memory cell comprises the first distributed diode, a second resistivity switching material region, and a third distributed diode which is shared with the fourth memory cell;

a first unique current path between a first bit line of the plurality of bit lines and a first word line of the plurality of word lines passes through the first distributed diode, the first resistivity switching material region and the second distributed diode; and a second unique current path between the first bit line of the plurality of bit lines and a second word line of the plurality of word lines passes through the first distributed diode, the second resistivity switching material region and the third distributed diode.

8. The device of claim 7, wherein:

each of the first, second, and third distributed diodes comprise rail shaped diodes;

the first resistivity switching material region is located between the first and the second distributed diodes;

the second resistivity switching material region is located between the first and the third distributed diodes;

the plurality of bit lines are located above the first, second, and third distributed diodes, such that the first bit line electrically contacts the first distributed diode; and the plurality of word lines are located below the first, second, and third distributed diodes, such that the first word line electrically contacts the second distributed diode and second word line electrically contacts the third distributed diode.

9. The device of claim 5, wherein:

each memory cell comprises a one time programmable or a rewritable nonvolatile memory;

each distributed diode comprises a p-n semiconductor diode, a p-i-n semiconductor diode, a metal insulator metal (MIM) diode, or a metal insulator-insulator metal (MIIM) diode; and each resistivity switching material comprises an antifuse dielectric, fuse, diode and antifuse dielectric arranged in a series, polysilicon memory effect material, metal oxide or switchable complex metal oxide material, carbon nanotube material, graphene switchable resistance material, phase change material, conductive bridge element, electrolyte switching material, switchable polymer material, or a carbon resistivity switching material.

10. A semiconductor device comprising a plurality of cross point memory cells, wherein each memory cell of the plurality of memory cells comprises:

a first rail structure, wherein the first rail structure comprises a first distributed diode;

a second rail structure, wherein the second rail structure comprises a second distributed diode; and a memory layer located directly between the first and the second rail structures.

11. The device of claim 10, wherein:

the first rail structures further comprises a bit line;

the second rail structure further comprises a word line; and a current path between the bit line and the word line passes through the memory layer at a junction where the first rail structure and the second rail structure cross.

12. The device of claim 11, wherein the first rail structure is segmented into first rail structure segments comprising one bit line and two or more first distributed diodes and the second rail structure is segmented into second rail structure segments comprising one word line and two or more distributed second diodes.

13. The device of claim 11, further comprising:

a plurality of first rail structures;

a plurality of second rail structures crossing over the plurality of first rail structures;

a plurality of bit lines electrically connected to respective ones of the plurality of first rail structures; and a plurality of word lines electrically connected to respective ones of the plurality of second rail structures.

14. The device of claim 13, wherein the plurality of first rail structures cross the plurality of second rail structures at a 90 degree angle.

15. The device of claim 10, wherein:

the first distributed diode comprises a p-n semiconductor diode, a p-i-n semiconductor diode, a metal insulator metal (MIM) diode, or a metal insulator-insulator metal (MIIM) diode;

the second rail distributed diode comprises a p-n semiconductor diode, a p-i-n semiconductor diode, a metal insulator metal (MIM) diode, or a metal insulator-insulator metal (MIIM) diode; and the memory layer comprises an antifuse dielectric, fuse, diode and antifuse dielectric arranged in a series, polysilicon memory effect material, metal oxide or switchable complex metal oxide material, carbon nanotube material, graphene switchable resistance material, phase change material, conductive bridge element, electrolyte switching material, switchable polymer material, or a carbon resistivity switching material.

16. The device of claim 10, wherein the first and the second distributed diodes comprise nanowires.

17. The device of claim 10, wherein the memory layer is selected from:

(a) a discontinuous memory layer whose portions are located only in locations between the first and the second rail structures where the first rail structures cross the second rail structures;

(b) a continuous memory layer; or (c) a rail shaped memory layer which is located in the first rail structure or in the second rail structure.

18. The device of claim 10, further comprising a monolithic three dimensional array of repeating first and second rail structures.

19. The device of claim 10, wherein:

the device comprises a plurality of memory cells;

a first memory cell of the plurality of memory cells comprises the memory layer, the first and the second distributed diodes; and each one of said first and second distributed diodes of the first memory cell is shared with different memory cells of the plurality of memory cells.

20. A method of manufacturing a semiconductor device, comprising:

forming a first rail structure, wherein the first rail structure comprises a first distributed diode;

forming a memory layer directly over the first rail structure; and forming a second rail structure directly over the first layer of memory material, wherein the second rail structure comprises a second distributed diode.

21. The method of claim 20, further comprising forming a plurality of bit lines and a plurality of word lines, such that a unique current path exists through the first layer of memory material between each bit line and each word line.

22. The method of claim 20, further comprising:

forming a first conductive layer over a substrate;

forming a first diode material on the first conductive layer;

etching the first diode material and first conductive layer to form a plurality of first rail structures each comprising a first distributed diode and a word line;

forming the memory layer on the first rail structures;
forming a second diode material on the memory layer;
forming a second conductive layer on the second diode material; and
etching the second diode material and second conductive layer to form a plurality of second rail structures each comprising a second distributed diode and a bit line.

23. The method of claim 20, further comprising:
forming a first conductive layer over a substrate;
forming a first diode material on the first conductive layer;
forming the memory layer on the first diode material;
etching the memory layer, the first diode material, first conductive layer to form a plurality of first rail structures each comprising a portion of the memory layer, a first distributed diode and a word line;
forming a second diode material on the memory layer;
forming a second conductive layer on the second diode material; and
etching the second diode material and second conductive layer to form a plurality of second rail structures each comprising a second distributed diode and a bit line.

24. The method of claim 20, further comprising:
forming a first conductive layer over a substrate;
forming a first diode material on the first conductive layer;
etching the first diode material and first conductive layer to form a plurality of first rail structures each comprising a first distributed diode and a word line;
forming the memory layer on the first rail structures;
forming a second diode material on the memory layer;
forming a second conductive layer on the second diode material; and
etching the memory layer, the second diode material and second conductive layer to form a plurality of second rail structures each comprising the memory layer, a second distributed diode and a bit line.

25. The method of claim 20, further comprising:
forming a first conductive layer over a substrate;
forming a first diode material on the first conductive layer;
forming the memory layer on the first diode material;
etching the memory layer, the first diode material, first conductive layer to form a plurality of first rail structures each comprising a portion of the memory layer, a first distributed diode and a word line;
forming a second diode material on the memory layer;
forming a second conductive layer on the second diode material; and
etching the memory layer, the second diode material and second conductive layer to form a plurality of second rail structures each comprising a second distributed diode and a bit line, such that the memory layer portions are located only at an intersection of the first and the second rail structures.

26. The method of claim 20, wherein:
the first distributed diode comprises a p-n semiconductor diode, a p-i-n semiconductor diode, a metal insulator metal (MIM) diode, or a metal insulator-insulator metal (MIIM) diode;
the second distributed diode comprises a p-n semiconductor diode, a p-i-n semiconductor diode, a metal insulator metal (MIM) diode, or a metal insulator-insulator metal (MIIM) diode; and
the memory layer comprises an antifuse dielectric, fuse, diode and antifuse dielectric arranged in a series, polysilicon memory effect material, metal oxide or switchable complex metal oxide material, carbon nanotube material, graphene switchable resistance material, phase change material, conductive bridge element, electrolyte switching material, switchable polymer material, or a carbon resistivity switching material.

27. A memory array, comprising:
a plurality of bit lines;
a plurality of word lines;
a plurality of first distributed diodes;
a plurality of second distributed diodes; and
a plurality of memory cells;
wherein:
each memory cell of the plurality of the memory cells comprises a memory layer located between a portion of one of the plurality of the first distributed diodes and a portion of one of the plurality of the second distributed diodes;
at least two of the plurality of the first distributed diodes are connected to each one of the plurality of bit lines;
at least two of plurality of the second distributed diodes are connected to each one of the plurality of word lines;
each of the plurality of the first distributed diodes is connected to the memory layer of at least two of the plurality of the memory cells; and
each of the plurality of the second distributed diodes is connected to the memory layer of at least two of the plurality of the memory cells.

28. The array of claim 27, wherein:
each of the plurality of the first distributed diodes is connected to the memory layer of four to sixteen memory cells; and
each of the plurality of the second distributed diodes is connected to the memory layer of four to sixteen memory cells.

29. The array of claim 27, wherein the first distributed diode and the second distributed diode of each of the plurality of the memory cells is shared with different memory cells of the plurality of the memory cells.

\* \* \* \* \*